Dec. 22, 1964 L. J. ALLEN ETAL 3,162,788

ELECTRONIC PACKAGING DEVICE

Filed Dec. 20, 1960 3 Sheets-Sheet 1

INVENTORS
LESLIE J. ALLEN
EDWARD J. LORENZ
WILLIAM J. RICHARDSON

BY J W Armbruster
ATTORNEY

Dec. 22, 1964 L. J. ALLEN ETAL 3,162,788

ELECTRONIC PACKAGING DEVICE

Filed Dec. 20, 1960 3 Sheets-Sheet 2

United States Patent Office 3,162,788

Patented Dec. 22, 1964

3,162,788

ELECTRONIC PACKAGING DEVICE

Leslie J. Allen, Wappingers Falls, and Edward J. Lorenz and William J. Richardson, Poughkeepsie, N.Y., assignors to International Business Machines Corporation, New York, N.Y., a corporation of New York Filed Dec. 20, 1960, Ser. No. 77,200

17 Claims. (Cl. 317—101)

This invention relates in general to printed circuit assemblies and connections and more particularly to circuit connecting strips which are also electronic component holders.

The invention involves a one-piece component holder in the form of a long thin metallic strip formed with a common continuous rail and extending therefrom a series of regularly spaced component grasping or holding fingers to embrace the cylindrical bodies of resistors, capacitors, etc. Each component is embraced in a vertical position and is to stand erect at right angles to a printed circuit board surface with a lower end lead soldered to a circuit land on the underside of the board, and a short upper lead welded to a tab or prong on the strip. The rail, fingers and tab of the strip are first blanked or cut into the thin strip with very little or no waste material and then formed with clips comprising two fingers opposite a single finger in semi-circular grasping postures. Offsetting of the top tab is such as to bring it into contact with a short top lead extending centrally from a grasped component whereto a fast connection is made by welding. Spacing of the holding fingers is such as to conform with printed circuit standards of line and land modular spacing. The rail is to be severed selectively between any holder portions to selectively separate or join any number of components.

In the usual form of printed circuit board assembly, the components on the board are arranged in horizontal positions wherein the dual lead resistors, diodes, etc. have both leads soldered into board conductors which involve relatively long paths between the soldered points. Between electrically connected components of the usual form, the pulse or current must travel down the lead, through the solder connection, through the printed conductor, through the other solder connection and up through the lead of the second component; all such connections adding to undesirable lengths of connections especially for high speed transistor and core pulse circuitry. The present component connecting strip eliminates most of such long paths and remote connections by welding short leads directly to the commoning strip and soldering short leads directly to printed circuit land areas around lead holes.

Another feature of the invention resides in the compact grouping of components in vertical positions where they occupy only a fraction of the board surface covered by the usual arrangement of components in horizontal positions.

In addition to the features as objects of the invention noted above relative to compact connection of components in standing position with short direct circuit connections with modular spacing and selective association, it is also an object to use the connector strips advantageously for logic circuit connections. Since the printed circuit lines are parallel and the lands thereon aligned, and since the connector strip is arranged at right angles to such lines and directly over a series of lands, extremely flexible arrangements of logic connections of components for "AND and OR" circuits and other Boolian elements may be made in a more expeditious fashion than heretofore. In transistor circuitry, the collector outputs and base inputs may be made common to several rows of printed conductor lands. These rows of lands are integrated in an alternating pattern of bases and collectors. The novel component strip is used to mount the input resistors and collector jumpers perpendicular to the rows of lands. The varying logical connections may be made selective in mounting the strip, resistors and jumpers and in cutting the rail.

Another object of the invention is the achievement of economical high density component packaging by the use of economical single-sided conductor printed wiring boards and the vertical placement of components thereon. The novel connector strips serve as second-level wiring and in addition act as holders for the components in the better vertical standing positions.

Another object of the invention is ease of assembly by use of the common connector strip. As a subassembly operation the connector strip is adapted to receive and hold components, be clipped to size, weld upper leads, clip upper leads, and clip lower leads, all as assembly line procedures before a component assembly is put on a printed circuit board and soldered thereon. By so arranging division of the assembly steps it is possible to avoid much preliminary handling of the boards and eliminate the damage occasioned heretofore by frequent handling of boards, especially of the kind bearing a large number of components.

A still further object of the invention is creation of a high density component package which is more easily cooled by air flow. In the present novel construction, not only does the holder strip serve as an erecting means to hold components on end so that the entire cylindrical surface is exposed to cooling air flow, but the strip also serves as a heat sink or heat radiating fin to conduct heat away from the components and out into the rail areas where the air flow may more easily dissipate it.

A further object of the invention is the provision of a simple form of conductor strip attached to one or more components with the leads of such components being the sole connection to a printed circuit board. In other words, the simple component holder strip per se is not connected directly to the printed circuit lines or lands at any point on the board, and the mechanical support as well as electrical connection of the strip is wholly through component leads soldered onto the board.

It is also an object of the invention to provide an alternative form of strip construction to that set forth in the preceding paragraph, and provide the strip with depending stanchion or mounting tab extensions to be fastened into the printed circuit board. The stanchions may be fixed to the board aside from the circuitry thereon merely for mechanical support of the strip and components thereon. As a second form of usage, a strip with stanchions and no components may be used as a jumper, in which case the stanchions or feed through mounting tabs do make connections with printed circuit lands and lines. And as a third form of usage, a strip with stanchions may have cooperative connections of both one or more stanchions and one or more component leads into the board circuitry. It is apparent that several other combinations of leads and stanchions as supports and/or circuit elements are possible.

The foregoing and other objects, features and advantages of the invention will be apparent from the following more particular description of the preferred embodiments of the invention, as illustrated in the accompanying drawings.

Figure 1:
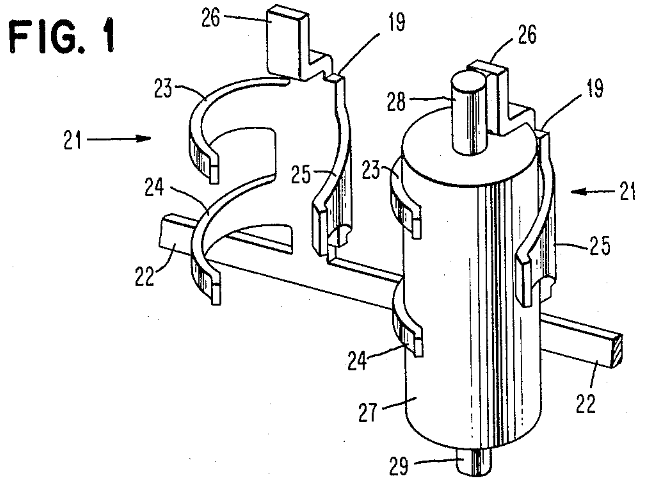
FIG. 1 is a perspective view showing a short portion of a connector strip with one empty holder and one set of fingers grasping a component in the vertical position in which it is inserted into a printed circuit board.
Figure 5:
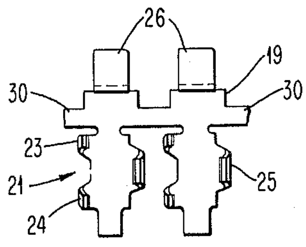
FIG. 5 is a detailed side elevation of an alternative form of component strip wherein the continuous rail is arranged across the upper part of the strip near the tab or prong to be welded to the upper lead wire as distinguished from the form of construction of FIG. 1 wherein the rail is along the lower side of the component holder beneath the three grasping fingers.
Figure 6:
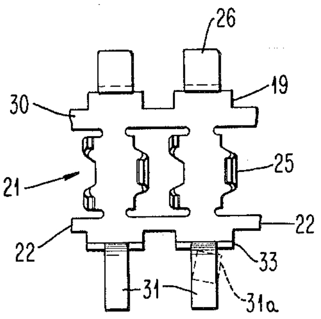

FIG. 6 is a detail elevation view of another alternative form of component strip holder wherein the rail is of a dual nature and the strip includes both rails of the variates shown in FIGS. 1 and 5. In addition to the variation of rail arrangement, the modification of FIG. 6 includes lower stanchion extensions which are to serve either as mounting means independently of the lower leads of components or as circuit connecting elements when the strip is to act as a jumper.

Figure 6A:
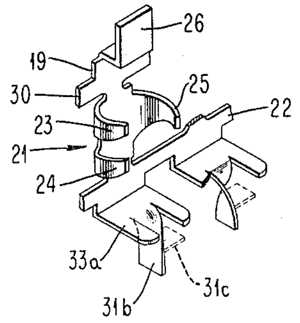

FIG. 6*a* is a detail perspective view of another variation of the component strip holder whereon an extra foot portion is added and the stanchion is of a twisted form for additional strength and rigidity. The foot portion lies flat on the printed circuit board and furnishes a firm base for the component holder when the stanchion ends are bent under the board. Because of the strip formations of foot portions, twisted stanchion portions, bent over component leads and bent over stanchion ends, and erect and strong component assembly is presented even before solder is applied to affix all bent ends against land areas which are with or without conductor lines.

Figure 7:
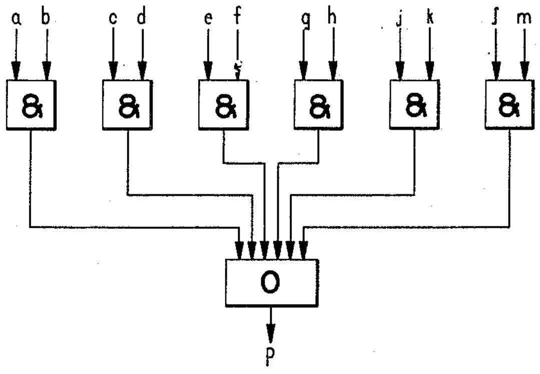

FIG. 7 is a diagrammatic showing of a logic circuit arrangement including a plurality of AND circuits and an OR circuit.

Figure 8:
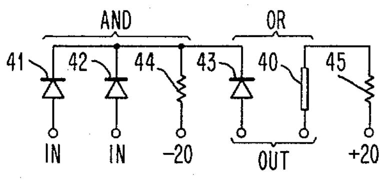

FIG. 8 is a portion of a wiring diagram illustrating part of FIG. 7.

Figure 9:
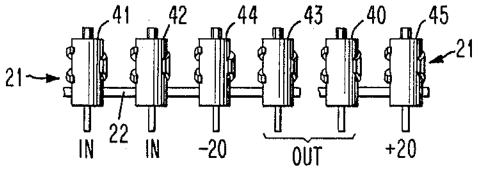

FIG. 9 is an elevation view showing how the assembly elements of the present invention may be used to hold components in accordance with the logical arrangements of FIGS. 7 and 8.

Figure 10:
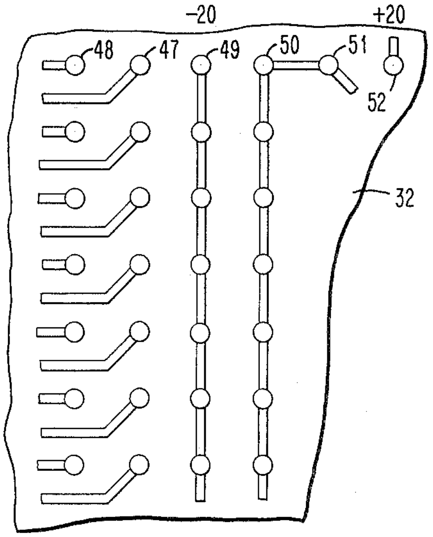

FIG. 10 is a detail plan view of printed circuit wiring arranged to agree with the positioning of the elements shown in FIG. 9 so that connections may be made as illustrated in FIGS. 7 and 8.

Figure 11:
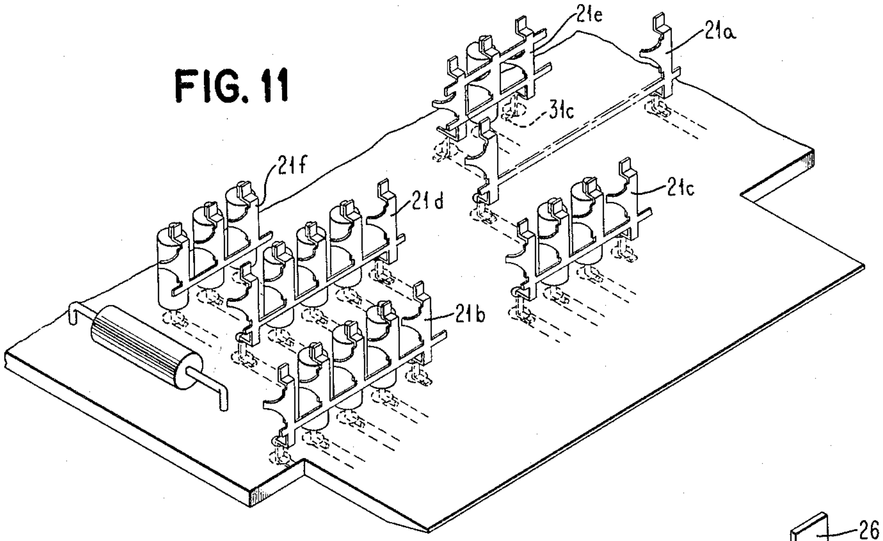

FIG. 11 is a perspective view of a printed circuit board having asembled thereon a number of different arrangements of component holding strips to illustrate the various arrangements whereby the component strips are to be used with and without feet or stanchions and with and without components.

Figure 2:
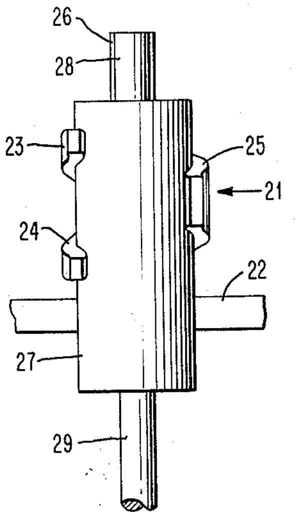
FIG. 2 is a front elevation view of a portion of the holding strip including an assembled component.
Figure 3:
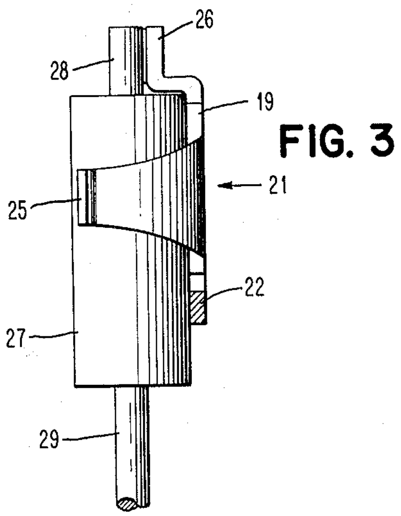
FIG. 3 is a side elevation view of the portion shown in FIG. 2 and illustrating the sectional area of the rail alongside the component body.

In FIGS. 1, 2 and 3 various showings are presented revealing the manner in which a component holding strip 21 is formed to receive components 27 such as resistors, diodes, solid metallic jumper means or any cylindrical body. The perspective view, FIG. 1, illustrates how the strip 21 is made of conductive strip material of any metal or conductive plastic, but preferably of thin brass or Phosphor bronze. The strip is a one piece affair with all the appendages formed out of one elongated thin strip of material and arranged so that the projections formed therefrom are punched in interleaved positions so that there is very little waste material or no waste at all if all projections are fitted closely together. For example, it is seen that the component grasping fingers 23, 24 and 25 are so arranged with two fingers on one side and the single finger 25 on the other side, and so shaped that the finger 25 of one holder is formed from material taken from the space between fingers 23 and 24 of an adjacent holder with the former being sheared out of the flat stock without any waste material between the cut edges.

Figure 4:
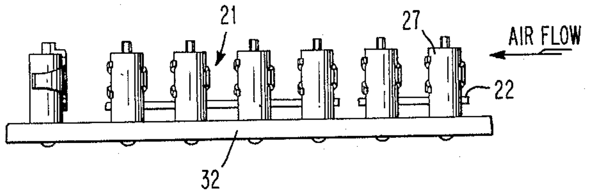
FIG. 4 is a side elevation view of a series of groups of components as they are assembled on a printed circuit board in a plurality of directions. This view also illustrates how the continuous strip may be severed to include any number of assembled components, or used without components but with metal inserts as an ordinary circuit connecting jumper means.

In FIG. 1 is also noted that the strip 21 is arranged with a common lower rail 22 which ties together a plurality of the component grasping formations. In FIG. 3 the sectional portion 22 shows how this rail extends along the lower rear side of assembled components on a strip 21. After one or more components are assembled on a strip 21, the rail 22 is adapted to be severed either before or after the soldering assembly operation which places it onto a printed circuit board 32 as shown in FIG. 4. In cases where a certain amount of stiffness is advisable, the strip of components is soldered onto the board first and then the rail 22 is severed selectively to permit desired components and printed circuit lines to remain connected while other assemblies are divided by cutting rail 22 at one or more points between the component holders.

Refering back to FIG. 1 it is noted that component holding portion 19 of the conducting strip 21 is formed with an offset tab or upper prong 26 which is designed to extend alongside and in contact with an upper lead portion 28 of any component 27 inserted between the holding fingers 23, 24 and 25. As shown in FIG. 3 this prong 26 is offset a distance almost equal to half the diameter of a component 27, a distance far enough to bring the inside of the prong into contact with the back of the component lead 28. It is in this position that a welding operation takes place between tab 26 and lead 28 to not only provide electrical connection between the component and the conducting strip 21 but also provide a structural means wherein the parts are made as one so that when the lower leads, leads 29, are bent against and soldered into the printed circuit board, the strip 21 is securely suspended by the welding attachment to one or more components. It is understood that the leads 28 and 29 are normally rather long and the shortening of them usually occurs after welding with regard to the upper lead 28 and before soldering with respect to the lower lead 29. Of course it is possible to clip the upper lead 28 short before welding and lower lead 29 may be drawn through a printed circuit land hole and bent in place in either a long or short condition before soldering with the clipping taking place either before or after soldering or not at all if the extending lead is to provide a further useful purpose in connection with the particular assembly.

Although only short portions of the conducting strip 21 are shown in the various illustrations, it is to be understood that it is susceptible to continuous forming by continuous cutting and forming dies so that long coiled lengths suitable for automation of assembly are possible.

The various advantages of the constructions shown in FIGS. 1, 2 and 3 may now be pointed out with the understanding that they also apply to the modifications described hereinafter. It is evident in FIG. 1 that as the component 27 is grasped by the fingers, so also a whole series of such components may be so held prior to a joint welding operation, and of course, this is an advantageous form of novel subassembly control whereby the operator is free to perform the connecting operation without the need for holding the different parts together. The same degree of aid to automation of course also carried over into the further assembly of such a holder 21 having a series of components welded thereon and all leads inserted into related holes of a printed circuit board as a self sustaining unit, because by merely bending the bottom leads 29 (FIG. 11) against the underside of the board, that is all that is required to hold the whole subassembly in position prior to and during soldering. It is of note also that the spacing between component holder portions 19 of the holder 21 are of modular spacing in conformity with the spacing of conductor lines and lands on the printed circuit board 32. This land or pad spacing is made common in both directions on printed circuit boards and therefore components arranged on the holding strip 21 are suited for direct connection in either direction with the land holes prearranged on the printed circuit board. In the usual form of assembly, the board 32 is provided with conducting lines and lands on one face only and that is on the underside of the board as shown in FIGS. 4 and 11. Since the printed circuit is on the bottom side as shown in FIG. 4, the bottom ends of the components are brought into contact with the top side of the board and the leads 29 are rather short and have a required length only sufficient to project through the board and bend against a land to make a solder connection. At this point it is well to note this advantage of the present construction which is the one relating to short lead connections. In circuitry involving high speed or high frequency pulsing it is an advantage to have all the connections between components as short as possible and it is evident that the present construction serves admirably in that respect.

Another advantage of the construction shown is that of the vertical placement of the components as distinguished from the usual horizontal positions of the cylindrical bodies. With the components standing on end, somewhat on the order of three times as many of them may be assembled on a printed circuit board, and in such positions the conductor strip 21 serves as a second level of wiring with the additional advantage that is adapted to be severed selectively and very readily in any rail position to conform with a variety of desired circuit connections.

A still further advantage of the strip connection of components in a vertical position is that of heat dissipation. With a plurality of components arranged erect in one line there is a better flow of air between such lines and into contact with more of the area of each cylindrical body as well as air circulation around the metallic strip which aids in heat dissipation by conduction and convection.

The advantages of the construction for forms of logic wiring are pointed out hereinafter with reference to FIGS. 7 to 10. Before noting such logic connections, it is well to turn attention to several alternative forms or modifications of the kind of conducting strip shown in FIGS. 1 to 4.

In FIG. 5 it is noted that as a variation a rail 30 may be formed on the component holder 21 along the top area directly under the prongs 26 as distinguished from the usual position of the rail 22 at the bottom as shown in FIG. 1. This form of top rail formation while it is not quite as structurally stiffened as the former construction, does have the advantage of permitting greater freedom and flexibility for the lower leads 29 and a more readily accessible rail structure for selective severing the strip along the top of subassemblies.

In FIG. 6 there is illustrated a modification with other aspects of novelty and useful performance. There it is noted that the holder 21 is formed with a double rail 22 and 30 which while it does involve a more troublesome form of severing condition, does add to the structural stiffness of the strip and has application under conditions of severe vibration or other rigid structural requirements. This form of construction of FIG. 6 also involves the formation of bottom prongs or tabs 31 which are the lower ends of an offset portion 33 formed on the bottom of a body area 19. Unused tabs 31 are cut off, but usually two or more of such tabs on a strip are used as electrical feed through tabs or as mounting tabs or stanchions by being inserted through land holes in the board and bent over as at 31*a* (FIG. 6). In the same sense that lower leads 29 may be useful for either electrical or structural uses or both, so also do the mounting tabs or stanchions 31 have both electrical and mechanical possibilities. In some instances, the stanchions are to serve merely as structural supports while in other instances they may act to provide electrical connections into printed circuit wiring either as jumper means in the absence of components or to enter into the wiring of components by forming part of a circuit involving the assembly of components on the same strip. A series of the various uses of the form of holder shown in FIG. 6 is illustrated in the perspective view in FIG. 11.

Although not evident in FIG. 6, in FIG. 11 it is apparent that the offset portion 33 (FIG. 6) is proportioned to fit against the top face of the board and extend far enough to locate the stanchion tab 31 in line with the center of a board land hole. When inserted into the hole, the tab 31 extends beyond the lower board face and the foil land thereon and is then bent back underneath the board as at 31*a* (FIG. 6) i.e., towards the body of the strip 21, and pressed flat against metal land area to make the strip assembly self supporting even before soldering which takes place later when the board is dip soldered or treated in some equivalent fashion.

Perspective view, FIG. 6*a*, shows another alternative form of component strip holder 21*e* which is quite the same as the strip of FIG. 6 except for the addition of foot portions 33*a* and the twisted stanchion tabs 31*b*. The strip of FIG. 6*a* is also a continuous strip with regularly spaced formations of component holders each comprising the usual three grasping fingers or clamps 23, 24 and 25, welding tab 26 and the two rails 22 and 30. However, instead of using a plain offset ledge as 33 in FIG. 6, the lower 90° bend 33*a* includes extending foot portions which add to the firmness and stability of the assembled strip when the foot portion 33*a* rests on a board and is held there securely when the stanchion portion 31*c* is bent under the board and at 90° to be flat against the underside of a land area before being soldered thereto.

It is noted that the stanchion or mounting tab 31*b* of FIG. 6*a* is not a straight form of tab 31 as in FIG. 6. Although either variety of tab may be used with either strip, it is found that a 90° twist in the length of tab 31*b* imparts additional stiffness and strength to it and has the further advantage of permitting the "bent over" portion 31*c* to be directed at right angles to the plane 19 of the strip material. This clamping action of bent tab 31*c* in a longitudinal strip direction is found to impart good rigidity and stability of the assembly before solder is applied. Alternate stanchions 31*b*, FIG. 6*a* are shown as twisted in different directions, however, the lower ends are always at right angles to the length of the strip.

FIG. 7 illustrates a portion of logic circuitry as illustrative of the kind of connections made more readily by use of the conductor strip 21 and the assembly of components thereon in accordance with the present invention. The particular arrangement of logic elements shown in FIG. 7 is one wherein a plurality of AND connections are connected to one OR element for a plurality of inputs resulting in 1 or 0 ouput. FIG. 8 is a portion of the wiring diagram showing components arranged in accordance with the results desired in FIG. 7. In FIG. 8 the AND circuit portion is seen to include three diodes, two of which are related to input lines and the other as part of the output to the OR circuit. A resistor 44 is also included in the AND circuit and this is connected to a voltage line of minus 20 volts. The OR circuit portion is seen to include a connection to the output of the AND circuit and also a resistor 45 connected to the hold line of plus 20 volts. The actual subassembly formation involving a conductor strip is shown in FIG. 9 and the components therein are arranged to agree with and provide the circuitry illustrated diagrammatically in FIG. 8. The three diodes 41, 42 and 43 are seen to be welded to the common conductor strip 21 and the resistor 44 is also held and welded thereon. Alongside this first subassembly comprising an AND circuit, is the dual arrangement of a metal feed through conductor 40 and a resistor 45 welded to a short holding strip 21 comprising the OR circuit portion of a horizontal array. Although both "AND" and "OR" portions are finally in severed portions of strip 21, it will be noted that for all previous assembly purposes they had the advantages of subassembly handling in long lengths and in unitary welding and inserting operations which make the novel strip so unusually useful for assembly of logic circuit connections.

FIG. 10 illustrates in a diagrammatic fashion the appearances of lines and land arrays on a printed circuit board 32 arranged in accordance with the need of the logic circuit already explained relative to FIGS. 7, 8 and 9. At the left it is seen that a whole series of input lines identified by 48 correspond with the inputs to the AND circuits mentioned hereinbefore. Therefore, the two vertical lines of land areas at the left correspond with the inputs to the AND circuits, and correspond with pairs of leads thereto, one such pair being illustrated in FIG. 9 as comprising diodes 41 and 42 arranged on strip 21 in direct alignment with and spaced to correspond with the spacing of the land areas 47 and 48. Alongside the lands 47 is a series of land areas 49 corresponding with the —20 line which is aligned with the lead of the resistors 44. Next to land 49 is land 50 which is part of the output wiring connections and designed to receive the lower lead of the diode 43. Alongside land area 50 and in direct alignment with lands 47–50 are a pair of other lands 51 and 52 relating to the OR part of the circuitry. The first land 51 is merely a connection to the output lines, and the metallic connection 40 on the component holder 21 has its lead soldered therein. The other OR component which is resistance 45 has its lower lead connected to the land 52 which provides +20 volts to the circuit connections.

Although FIG. 10 is shown over a limited area it is apparent that through the arrangements of vertical lines of printed circuitry relating to input, output and various voltage lines (which may include transistor, base, collector and emitter lines) and associating therewith horizontal arrays of components at selective positions designed to be connected selectively and isolated selectively by severance of the strip 21, a flexible arrangement of logic circuitry is provided. This is due to the functional usefulness of the novel form of conductor strip 21 and the selective assembly thereon and connection of components in a high density fashion which is superior to the packaging of components provided heretofore.

In the perspective view, FIG. 11, a series of assemblies are shown to illustrate how the conducting strip 21 may be arranged with or without components and with or without stanchions to provide connections to the printed circuit wiring of a board 36. The strip 21*a* is shown with the pair of stanchions assembled into wiring in such a fashion that the function is solely that of a jumper connection without holding any diodes or other components on the conductor. For longer spans and greater stability a jumper such as this could use two or more metal conductors such as part 40 in FIG. 9. In the assembly of strip 21*b* the stanchions are used merely for mechanical supports and there are no feed through electrical connections associated therewith, all of the electrical connections being established by means of the leads on the components grasped and welded to strip 21*b*. Strip 21*c* illustrates a form of connection wherein a single feed through electrical connection is made through the stanchion at the left and the remainder of the electrical connections are made by means of component leads while the stanchion at the right is merely for mechanical support purposes. The fourth form of conductor strip 21*d* is of the variety wherein a pair of stanchions are both used for conductive feed through purposes with both of them connected to printed circuit wiring. The components thereon are also connected and form a multiple arrangement of electronic wiring in conjunction with the printed circuit wiring. The fifth strip 21*e* is of the FIG. 6*a* variety and shows a left stanchion used for feed through purposes, a central area holding a component and having the related foot portions cut off, and a right stanchion used purely for mechanical support. Of course, in addition to the showings in FIG. 11 of the various types of rail, stanchion and foot connections, it is possible to include the types of connections shown in FIGS. 1 through 4 wherein the lower prongs or mounting stanchions 31 are not involved, but all connections are through component leads. Strip 21*f* is one such showing. It is obvious that other various combinations of these arrangements may be made, all coming within the scope of the teachings revealed in the various figures illustrating the invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A printed circuit assembly comprising a board of insulating material bearing conductive circuit lines, a row of components standing on end and with the bodies thereof arranged side by side on said board, said components each having extending lead wires on ends, some of said lead wires being electrically connected to said circuit lines, and a common strip formed with regularly spaced flexible clips for receiving and holding said component bodies in said standing on end position and in alignment with said circuit lines to be connected thereto.

2. An assembly as set forth in claim 1 wherein said strip is formed with a narrow rail section between each pair of clips, whereby said strip is easily severed between any pair of clips to selectively associate components on integral portions of the strip.

3. An assembly as set forth in claim 1 wherein said strip is made of conductive material and formed with offset tabs, one such tab at a midpoint of each clip, each tab contacting with a short length of lead extending from a component in a related clip, whereby said short lead may be permanently connected to said tab.

4. An assembly as set forth in claim 1 wherein said strip is formed with a plurality of downwardly extending stanchions, one for each clip, said stanchions being severable to eliminate all except those serving as supports by being connected to said board for mechanical support.

5. An assembly as set forth in claim 3 wherein said strip is formed with a plurality of downwardly extending stanchions, one in alignment with each board circuit line, said stanchions being severable to eliminate all except those serving as electrical connections to said board lines.

6. A circuit assembly comprising a support means, a set of circuit lines, a series of sets of components arranged in rows and columns on said support means, each set of components arranged side by side and standing vertically on end, said components each having extending lead wires and common heat sink support and conduct strips, one for each of said sets of components, each of said strips being formed with spaced clips for receiving and holding said components in said standing on end position, and also formed with tabs to which certain lead wires are connected while others of said leads are connected to said circuit lines, whereby cooling air may be directed through said standing component rows and columns and dissipate the heat therefrom as well as from the connected heat sink support and conduct strips.

7. A logical circuit assembly comprising a support means and sets of parallel circuit lines supported thereon, with modular spacing, a series of sets of logic control components arranged in rows on said support means and at an angle to said circuit lines, each set of components arranged side by side with modular spacing agreeing with the spacing of said circuit lines, said components having extending lead wires, and common support and conduct strips, one for each said set of components, each of said strips being formed with spaced clips for receiving and holding said components with modular spacing, said lead wires optionally connected to said strip and circuit lines for logical connections.

8. The circuit assembly set forth in claim 7 wherein said sets of parallel circuit lines include repetitive sets of transistor element lines for selective connection to base, emitter and collector leads.

9. A component assembly article comprising a one piece conductive strip formed with a plurality of regularly spaced clip fingers for embracing component bodies, a thin continuous severable rail between said clip fingers and offset tabs formed out of said strip and above and between each set of related clip fingers, each tab serving to come into contact with a lead wire out of a component and to be attached thereto.

10. An article of the kind set forth in claim 9 wherein each set of clip fingers for embracing one component body comprises one finger opposite the space between two facing fingers, said fingers being shaped to be formed out of the strip without waste material therefrom.

11. An article of the kind set forth in claim 9 wherein said strip is formed with an offset prong and a straight stanchion extension opposite each of said tabs and below and between each set of related clip fingers, whereby each stanchion extension may serve as a mechanical support and in conjunction with a line of a circuit as an electrical connection.

12. A component assembly article comprising a conductive strip formed with a plurality of spaced clip fingers for embracing component bodies, and tabs formed on said strip relative to related clip fingers, each tab serving to contact with a lead wire out of one of said components.

13. A component assembly device comprising the article set forth in claim 12 and a plurality of components clipped onto said strip by said fingers with lead wires of the components aligned with said tabs in a continuous array along a straight line, whereby welding of said wires to said tabs may be performed in alignment.

14. The article set forth in claim 12 wherein said strip is formed with a plurality of spaced foot extensions and centrally extending twisted stanchion portions, said foot and stanchion portions being distinct from said fingers and tabs also formed on said strip, whereby said strip is designed to hold and connect components preliminary to circuit assembly and then support said components in a circuit assembly.

15. A component holder assembly comprising a plurality of components with extending lead wires, a component holder strip of conductive material formed with a series of spaced tabs, said tabs being spaced to provide room for a component to be associated with each tab on said strip, said tabs being offset to come into contact with a lead wire of a component the body of which is against said strip, and said strip being formed with narrow severable rail sections whereby a selective length of strip may be cut and a selective number of components may be associated in one subassembly package.

16. A component holder assembly comprising a plurality of components with extending lead wires, a component holder strip of conductive material formed with a series of tabs of modular spacing, each of said tabs being offset to connect with a lead wire of a component the body of which is against said strip, and said strip being formed with projecting offset stanchion portions opposite said tabs, whereby said assembly may be mounted erect mechanically supported on said stanchions and electrically connected by said stanchions.

17. A component holder of variable length comprising a continuous strip of conductive material formed with clip fingers at regular intervals to receive components having leads at both ends of cylindrical bodies grasped by said clip fingers, said holder having thin severable joining strips between said clips and, above said clips, and prongs whereon upper ones of said leads may be welded, whereby said holder and components as a unit may be soldered onto a printed circuit board in a standing position with the lower leads engaged thru holes in the board.

References Cited in the file of this patent

UNITED STATES PATENTS

| | | |
|---|---|---|
| 2,007,224 | Stoekle | July 9, 1935 |
| 2,779,094 | Christoffel | Jan. 29, 1957 |
| 2,911,572 | Francis | Nov. 3, 1959 |
| 2,947,965 | Scoville | Aug. 2, 1960 |
| 3,020,520 | Berg | Feb. 6, 1962 |
| 3,065,385 | Mierendorf | Nov. 20, 1962 |